United States Patent
Traxler

(10) Patent No.: US 6,414,480 B1
(45) Date of Patent: Jul. 2, 2002

(54) METHOD AND SYSTEM FOR EDDY CURRENT INSPECTION CALIBRATION

(75) Inventor: Joseph Anthony Traxler, Hamilton, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/644,037

(22) Filed: Aug. 22, 2000

(51) Int. Cl.[7] ............................................... G01R 35/00
(52) U.S. Cl. ........................................ 324/202; 324/234
(58) Field of Search .......................... 324/202, 228–243, 324/262

(56) References Cited

U.S. PATENT DOCUMENTS

| | | | |
|---|---|---|---|
| 3,718,855 A | * | 2/1973 | Rogel et al. ................ 324/202 |
| 4,425,545 A | | 1/1984 | Scalese ....................... 324/202 |
| 4,963,826 A | | 10/1990 | Capobianco et al. ........ 324/202 |
| 5,019,775 A | | 5/1991 | Moulder et al. ............ 324/202 |
| 5,111,142 A | * | 5/1992 | Mazzone et al. ........... 324/262 |
| 5,130,651 A | * | 7/1992 | Morrey, Jr. ................. 324/225 |
| 5,430,376 A | * | 7/1995 | Viertl ......................... 324/227 |
| 5,648,721 A | * | 7/1997 | Wincheski et al. ......... 324/240 |
| 5,854,553 A | * | 12/1998 | Barclay et al. ......... 324/207.16 |

* cited by examiner

Primary Examiner—Edward Lefkowitz
Assistant Examiner—Reena Aurora
(74) Attorney, Agent, or Firm—V. Ramaswamy; Pierce Atwood

(57) ABSTRACT

Calibration of an eddy current inspection system having an eddy current probe and a rotatable turntable is accomplished using a circular calibration standard having a notch of known dimensions formed therein. The calibration standard is mounted on the turntable for rotation therewith. The eddy current probe is positioned adjacent to the calibration standard, and the calibration standard is then rotated so that the probe scans the notch. By providing a rotating scan of the calibration standard, higher scan speeds and more accurate calibrations are achieved.

15 Claims, 2 Drawing Sheets

METHOD AND SYSTEM FOR EDDY CURRENT INSPECTION CALIBRATION

BACKGROUND OF THE INVENTION

This invention relates generally to eddy current inspection and more particularly to high speed eddy current calibration.

Eddy current inspection is a commonly used technique for nondestructively detecting discontinuities or flaws in the surface of items made of electrically conductive material, including many gas turbine engine components.

Eddy current inspection techniques are based on the principle of electromagnetic induction in which eddy currents are induced within the component under inspection by application of alternating magnetic fields. Known eddy current probes include absolute probes, which contain a single inductive coil, and differential probes, which have a drive coil and a sense coil. In the case of a differential probe, eddy currents are induced in the component under inspection when the probe is moved into proximity with the component by alternating magnetic fields created in the drive coil. The eddy currents produce a secondary magnetic field that is detected by the sense coil, which converts the secondary magnetic field into an electrical signal that may be recorded and/or displayed for analysis. As the eddy current probe is passed over the component, the presence of cracks and other discontinuities or deformations in the component will produce changes in the magnitude of the induced eddy current as compared to the magnitude of the induced eddy current in areas that do not have such anomalies. This results in corresponding variations in the magnitude of the signal output by the sense coil. Hence, the output signal, specifically the amplitude of the output signal variations, is an indication of the condition of the component. An eddy current machine operator may then detect and size flaws by monitoring and analyzing the output signals.

Eddy current probes are typically calibrated by using a reference or calibration standard having simulated flaws of known dimension formed therein. Typically, the calibration standard is a square plate having one or more notches of prescribed dimensions electrical discharge machined (EDM) therein to simulate flaws. Calibration of an eddy current probe is accomplished by performing a rectilinear scan of the EDM notch in the calibration standard. The output signals obtained from scanning the known notch are compared to output signals produced by the probe from an actual flaw or crack in a component under inspection to provide an indication of the severity of the flaw.

The relatively small size of the calibration standards (they are typically a 2.5 to 3 inch square) present a short distance to be scanned during the calibration. Because of probe acceleration and deceleration times, the short scan distance limits the scan speed that can be achieved during calibration. This in turn limits the probe scan speed that can be utilized during inspection. Furthermore, in a production environment, eddy current calibration is often performed many times per day on each system (typically before and after each type of part is inspected). Frequent calibrations are needed because of the calibration accuracy that is currently available.

Accordingly, there is a need for eddy current calibration methods and systems that can achieve better scan speeds and require less frequent calibrations.

BRIEF SUMMARY OF THE INVENTION

The above-mentioned need is met by the present invention which provides method and system for calibrating an eddy current inspection system having an eddy current probe and a turntable that is rotatable about an axis. A calibration standard having a notch of known dimensions formed therein is mounted on the turntable for rotation therewith. The eddy current probe is positioned adjacent to the calibration standard, and the calibration standard is then rotated so that the probe scans the notch. By providing a rotating scan of the calibration standard, higher scan speeds and more accurate calibrations are achieved.

The present invention and its advantages over the prior art will become apparent upon reading the following detailed description and the appended claims with reference to the accompanying drawings.

BRIEF DESCRIPTION OF THE DRAWINGS

The subject matter which is regarded as the invention is particularly pointed out and distinctly claimed in the concluding part of the specification. The invention, however, may be best understood by reference to the following description taken in conjunction with the accompanying drawing figures in which:

DETAILED DESCRIPTION OF THE INVENTION

Figure 1:
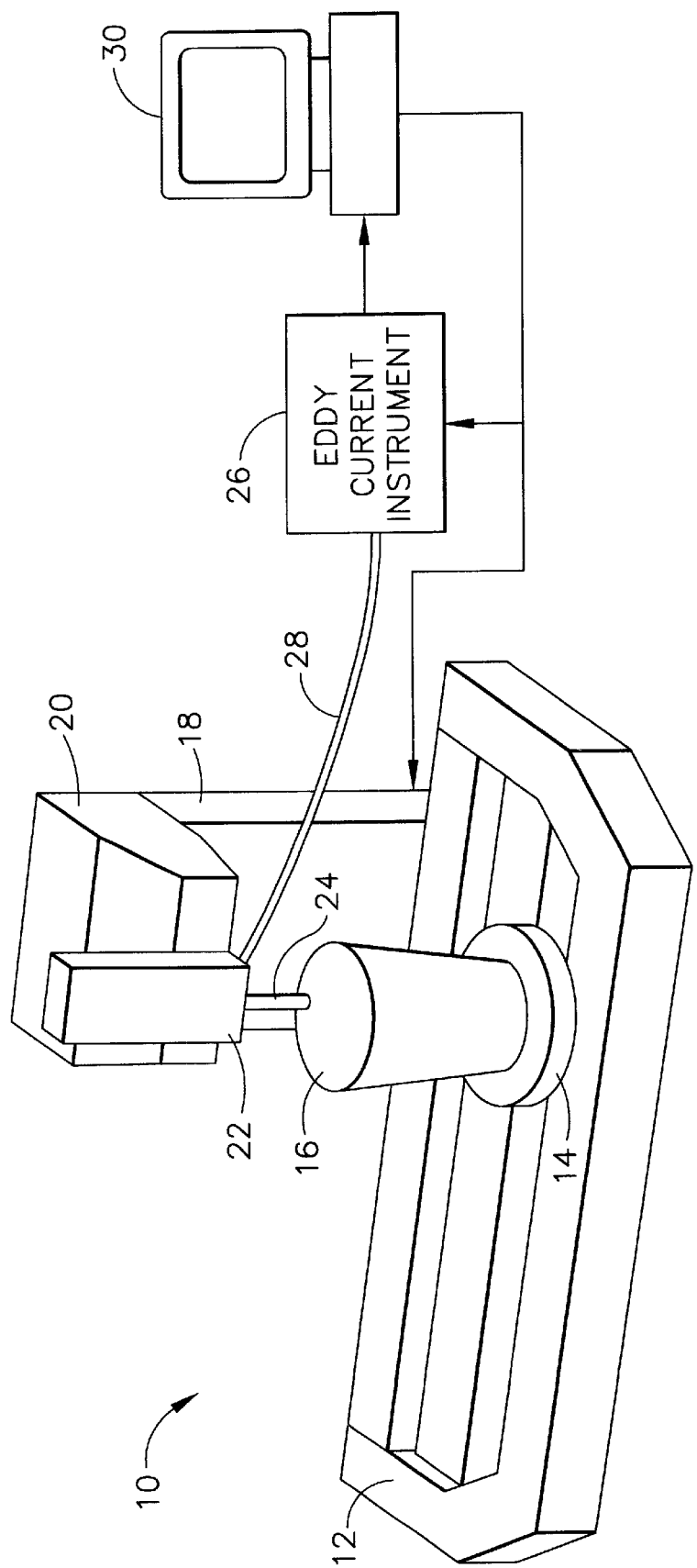
FIG. 1 is a perspective view of an eddy current inspection system.

Referring to the drawings wherein identical reference numerals denote the same elements throughout the various views, FIG. 1 shows an eddy current inspection system 10 having a base 12 that is a substantially rectangular frame. A turntable 14 is rotatively mounted to the upper side of the base 12. The turntable 14 is driven by a motor (not shown) to rotate about a vertical axis and is adapted to support a part or component 16 that is to be inspected. As shown in FIG. 1, the component 16 is rotor spool used in a gas turbine engine. However, it should be understood that the inspection system 10 could be used to inspect almost any component made of an electrically conductive material.

The eddy current inspection system 10 further includes a vertical column 18 fixed to the rear of the base 12. A horizontally extending support arm 20 is mounted to the column 18 so as to overhang the base 12. Mounted to the distal end of the support arm 20 is a probe manipulator 22 that carries an eddy current probe 24. In a manner known in the art, the probe manipulator 22 is pivotable about a horizontal axis that extends parallel to the base 12 to move the probe 24 relative to the component 16. Furthermore, the component 16 can be moved relative to the probe 24 by rotation of the turntable 14. The turntable 14 is also slidable laterally along the base 12 so as to position the component 16 laterally with respect to the column 18. The probe manipulator 22 includes known means for biasing the probe 24 into proximity or contact with the component 16 during inspection thereof. The probe 24 can be any type of known eddy current probe, including absolute probes and differential probes. As is known in the art, when in proximity or contact with the component 16, the probe 24 will induce eddy currents in the component 16. The probe 24 will also detect the secondary magnetic field that is produced by the eddy currents and output electrical signals representative of the detected magnetic field. Generally, the probe 24 will be capable of detecting flaws as small as 0.010 inches in length.

The system 10 includes an eddy current instrument 26 of a known type that is connected to the probe 24 by a lead 28. The eddy current instrument 26 provides signals that cause the probe 24 to generate the alternating magnetic fields that will produce eddy currents in the component 16. The eddy current instrument 26 also receives output signals from the probe 24 representative of the secondary magnetic field produced by the eddy current and detected by the probe 26. The eddy current instrument 26 typically includes circuitry that changes in impedance in response to a variation in the probe output signal. The output of the instrument 26 is fed to a computer 30, which may be a standard PC. The computer 30 records and/or displays the output for analysis by the system operator. The computer 30 is also programmed to provide control signals to the eddy current instrument 26 and to control the operation of the system 10, including the movement of the turntable 14 (and hence of the component 16) and the probe 24.

During an inspection operation, the probe 24 is moved relative to the component 16 (either by movement of the probe manipulator 22, rotation of the component 16, or both) in response to control signals from the computer 30. As the probe 24 moves relative to a homogeneous surface of the component 16, the magnetic induction and hence the probe output signals will remain approximately constant. However, when the probe 24 encounters a crack or other flaw in the component 16, a change in the eddy currents flowing through the component 16 results in a change in the probe output signals. The magnitude of the output signal variation is indicative of the size of the discontinuity.

Figure 2:
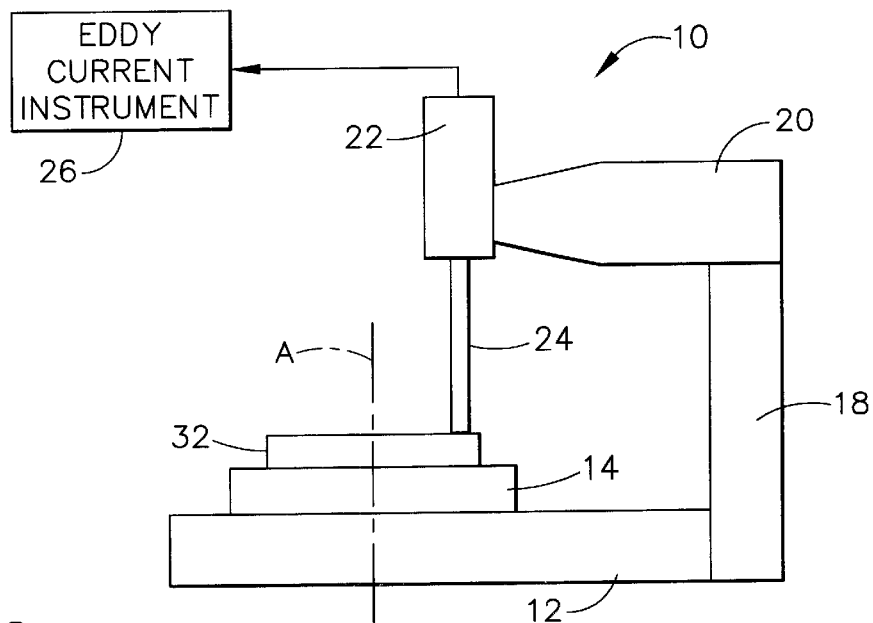
FIG. 2 is a side view of the eddy current inspection system of FIG. 1 set up for a calibration process.
Figure 3:
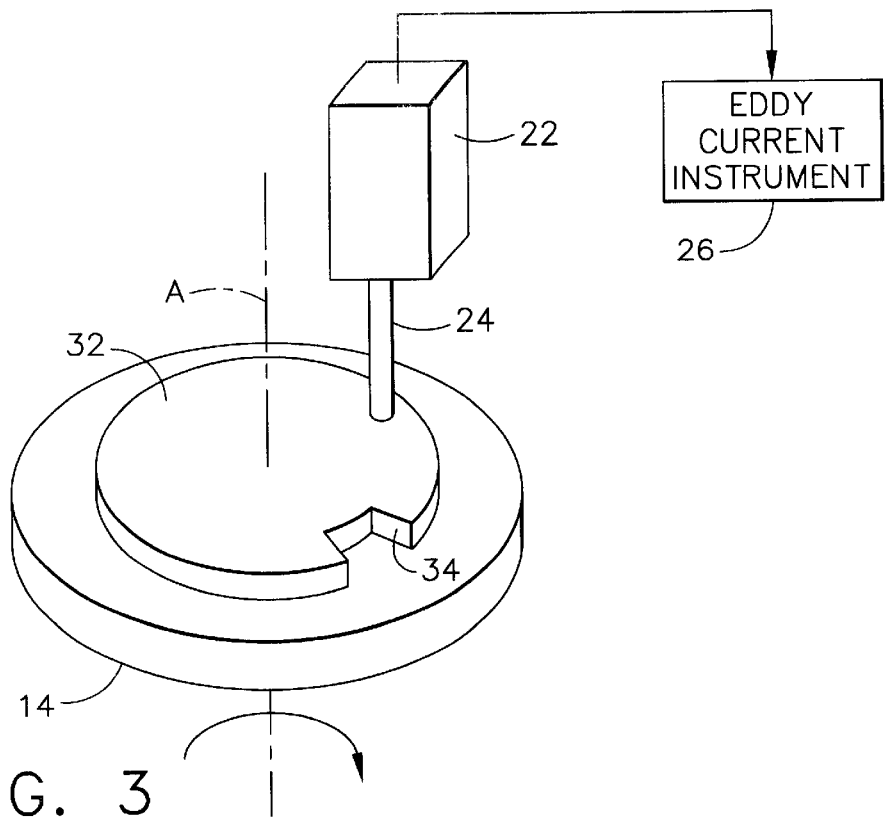
FIG. 3 is a partial schematic view of the eddy current inspection system of FIG. 1 demonstrating a calibration process.

The eddy current inspection system 10 is calibrated so that the output signals obtained during inspection of a component can be properly interpreted. Referring now to FIGS. 2 and 3, it is seen that calibration is accomplished using a circular calibration standard 32 that is placed on the turntable 14 for rotation therewith. The calibration standard 32 is shown to be a disk in FIGS. 2 and 3, but can be any configuration having a circular cross-section, including a cylinder or a ring. As show in FIG. 3, a small notch 34 of known dimensions is formed in the surface of the calibration standard 32 to simulate a flaw. The notch 34 is substantially perpendicular to the top and bottom surfaces of the calibration standard 34 and is precision machined using a process such as electrical discharge machining such that it will produce a reproducible, known signal when scanned by the probe 24. Although shown in exaggerated size in FIG. 3 for clarity of illustration, the notch 34 typically has a length of about 0.030 inches, a depth of about 0.015 inches and a width of about 0.003 inches. However, it should be understood that the particular notch dimensions may vary depending on the particular application for which the calibration standard 32 is being used.

In practice, the calibration standard 32 is fixed to the turntable 14 in a centered location so as to rotate about the vertical axis A, and the probe 24 is positioned with respect to the calibration standard 32 so as to be able to scan the notch 34. The calibration standard 32 is then caused to rotate via the turntable 14. As the calibration standard 32 rotates, the notch 34 will pass under the probe 24 such that the probe 24 scans the notch 34. In response, the probe 24 produces output signals that are indicative of the size of the notch 34 and thus determines the response of the system 10 to the presence of a known discontinuity. This data is then used as a basis for comparison for output signals produced by the probe 24 from an actual flaw or crack in a component under inspection to provide an indication of the severity of the flaw.

Because the calibration standard 32 is rotating about the central axis A, the notch 34 will repeatedly pass under the probe 24 for as long as the turntable 14 is rotating. That is, the notch 34 will travel along a closed, circular path. This means that the calibration scan speed is not limited by acceleration and deceleration times, as is the case with a conventional rectilinear scan. The present invention thus allows for calibration scan speeds of 12 inches per second and higher. This means that equivalent high scan speeds can be used during component inspections. Previously, calibration and inspection speeds were limited to about 5 inches per second.

Conventionally, calibration standards are made of a material that is the same as or very similar to the material of the component to be inspected. For example, gas turbine engine components are commonly made from a wide variety of materials including titanium and various nickel- and cobalt-based superalloys. This results in the need to have a large number of calibration standards made for each type of material, flaw and geometrical configuration to be inspected. However, in one preferred embodiment of the present invention, calibration correction factors that compensate for material variations are used to reduce the number of calibration standards. Specifically, correction factors would be obtained by scanning a set of master standards for each material of interest and then comparing the outputs to determine the appropriate correction factors. The correction factors would then be used to adjust the test frequency of the eddy current instrument 26 in a manner that is known in the art whenever a calibration process is to be carried out. By way of example, if the calibration standard 32 is made of titanium and the component to be inspected is also made of titanium, then the test sensitivity would be set at a first value, say 2000 mV. But if the calibration standard 32 is made of titanium and the component to be inspected is made of Inconel superalloy, then the test sensitivity would be set at a second value, say 1400 mV. Thus, for a given type of flaw, this would allow the use of a single titanium calibration standard, as opposed to a separate calibration standard for each material.

The foregoing has described a method and system of calibrating eddy current inspection devices that requires a smaller number of calibration standards and provides higher scanning speeds during calibration. This means that higher scanning speeds can be used during inspection after the system 10 has been calibrated. Furthermore, the system provides more accurate calibration, due in part to its minimal speed variation. Accordingly, less frequent calibrations are needed. For instance, the system 10 could be calibrated only once per day.

While specific embodiments of the present invention have been described, it will be apparent to those skilled in the art that various modifications thereto can be made without departing from the spirit and scope of the invention as defined in the appended claims.

What is claimed is:

1. A method of calibrating an eddy current inspection system having an eddy current probe and a turntable that is rotatable about an axis, said method comprising:

providing a calibration standard having a notch of known dimensions formed therein, wherein said notch is located on said calibration standard so as to travel in a closed path when said calibration standard is rotated;

mounting said calibration standard on said turntable for rotation therewith;

positioning said eddy current probe adjacent to said calibration standard; and rotating said calibration standard so that said probe scans said notch.

2. The method of claim 1 wherein said calibration standard has a circular configuration.

3. The method of claim 2 wherein said calibration standard has a central axis and is fixed on said turntable so as to rotate about said central axis.

4. The method of claim 1 wherein said notch is precision machined into said calibration standard.

5. The method of claim 1 wherein said calibration standard is rotated to provide motion of said notch relative to said eddy current probe at a speed of about 12 inches per second or higher.

6. The method of claim 1 wherein a single calibration standard is used for all component materials to be inspected.

7. The method of claim 6 further comprising applying a calibration correction factor to compensate for material variations.

8. A system for providing calibrated eddy current inspection of components, said system comprising:

a turntable mounted for rotation about an axis;

an eddy current probe supported above said turntable; and a calibration standard mounted on said turntable, said calibration standard having a notch of known dimensions formed therein, said notch being located on said calibration standard so as to travel in a closed path when said calibration standard is rotated, wherein said probe is located so as to scan said notch as said calibration standard is rotated by said turntable.

9. The system of claim 8 wherein said calibration standard has a circular configuration.

10. The system of claim 9 wherein said calibration standard has a central axis and is fixed on said turntable so as to rotate about said central axis.

11. The system of claim 8 wherein said calibration standard rotates to provide motion of said notch relative to said eddy current at a speed of about 12 inches per second or higher.

12. The system of claim 8 wherein said notch is precision machined into said calibration standard.

13. The system of claim 8 further comprising means for compensating for material variations between said calibration standard and a component to be inspected.

14. A method of calibrating an eddy current inspection system, the method comprising the steps of:

providing an eddy current probe;

providing a calibration standard; and providing movement of said calibration standard relative to said eddy current probe; wherein a selected portion of said calibration standard moves relative to said eddy current probe at a speed of about 12 inches per second or higher, wherein said selected portion of said calibration standard comprises a feature of known dimension, and said calibration standard is rotated about an axis to provide movement of said feature along a closed path.

15. A method of calibrating an eddy current inspection system, the method comprising the steps of:

providing an eddy current probe;

providing a calibration standard having a feature of known dimension; and providing rotation of the calibration standard to provide movement of said feature relative to said eddy current probe along a closed path.

* * * * *